United States Patent
Wang

(10) Patent No.: US 7,961,479 B2
(45) Date of Patent: Jun. 14, 2011

(54) SHIELD CAN AND METHOD FOR FABRICATING THE SAME

(75) Inventor: Qi Wang, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 49 days.

(21) Appl. No.: 12/546,790

(22) Filed: Aug. 25, 2009

(65) Prior Publication Data

US 2010/0097757 A1    Apr. 22, 2010

(30) Foreign Application Priority Data

Oct. 17, 2008  (CN) .................... 2008 1 0304966

(51) Int. Cl.
*H05K 9/00* (2006.01)
*H05K 7/20* (2006.01)

(52) U.S. Cl. ........ 361/818; 361/690; 361/816; 174/350; 174/377; 174/383; 174/385

(58) Field of Classification Search .................. 361/800, 361/816, 818, 690; 174/350, 354, 377, 383, 174/385; D14/432; 439/607.35
See application file for complete search history.

(56) References Cited

U.S. PATENT DOCUMENTS

| | | | | |
|---|---|---|---|---|
| 5,436,802 A * | 7/1995 | Trahan et al. | ................. | 361/816 |
| 5,614,694 A * | 3/1997 | Gorenz et al. | ................. | 174/375 |
| 6,136,131 A * | 10/2000 | Sosnowski | ................. | 156/256 |
| 6,178,097 B1 * | 1/2001 | Hauk, Jr. | ................. | 361/816 |
| 6,501,016 B1 * | 12/2002 | Sosnowski | ................. | 174/382 |
| 6,897,371 B1 * | 5/2005 | Kurz et al. | ................. | 174/382 |
| 7,208,675 B2 * | 4/2007 | Horng | ................. | 174/377 |
| 7,544,885 B2 * | 6/2009 | Horng | ................. | 174/350 |
| 2002/0139552 A1 * | 10/2002 | Chang | ................. | 174/35 R |
| 2006/0121784 A1 * | 6/2006 | Lee | ................. | 439/607 |

* cited by examiner

*Primary Examiner* — Robert J Hoffberg
(74) *Attorney, Agent, or Firm* — Steven M. Reiss

(57) ABSTRACT

A shield can includes a frame having a hole in the top wall thereof, and an enclosure attached to the frame and covering the hole. The frame and the enclosure are formed by punching a metallic piece, the enclosure corresponds to the hole in shape and size, the enclosure is fixed to the upper surface of the top wall. The invention also discloses the method for fabricating the shield can.

9 Claims, 4 Drawing Sheets

SHIELD CAN AND METHOD FOR FABRICATING THE SAME

BACKGROUND

1. Technical Field

The present disclosure relates to a shield can for portable electronic devices and a method for fabricating the same.

2. Description of Related Art

Many electronic components in electronic devices, such as capacitors, are protected by shield cans from external/internal electromagnetic interferences (EMI). A typical shield can is a metallic enclosure locked to a metallic frame. For example, FIG. 4 shows a shield can 50 including a frame 52 and a punched enclosure 54. The frame 52 has two apertures 522 through the top wall and a plurality of latching holes 524 through the peripheral wall. The enclosure 54 has a shielding panel 541 and a plurality of folding pieces 542 perpendicularly extending from the peripheral edge of the shielding panel 541. Each of the folding pieces 542 has a corresponding latching protrusion 5422 for securely engaging into a corresponding latching hole 524 to lock the enclosure 54 to the frame 52. Meanwhile, the shielding panel 541 covers the apertures 522 of the frame 52.

During manufacturing, the frame 52 and the enclosure 54 need to be punched respectively from two metallic plates. The punching precision needs to be maintained for ensuring an accurate securing and covering of the enclosure 54 to the frame 52. However, this precise punching is usually costly and time consuming.

Therefore, there is room for improvement within the art.

BRIEF DESCRIPTION OF THE DRAWINGS

Many aspects of the disclosed shield can be better understood with reference to the following drawings. The components in the drawings are not necessarily drawn to scale, the emphasis instead being placed upon clearly illustrating the principles of the exemplary shield can. Moreover, in the drawings, like reference numerals designate corresponding parts throughout the several views.

DETAILED DESCRIPTION OF THE EMBODIMENT

The disclosed shield can is suitable for electronic devices, such as mobile phones, personal digital assistants (PDAs), etc.

Figure 1:
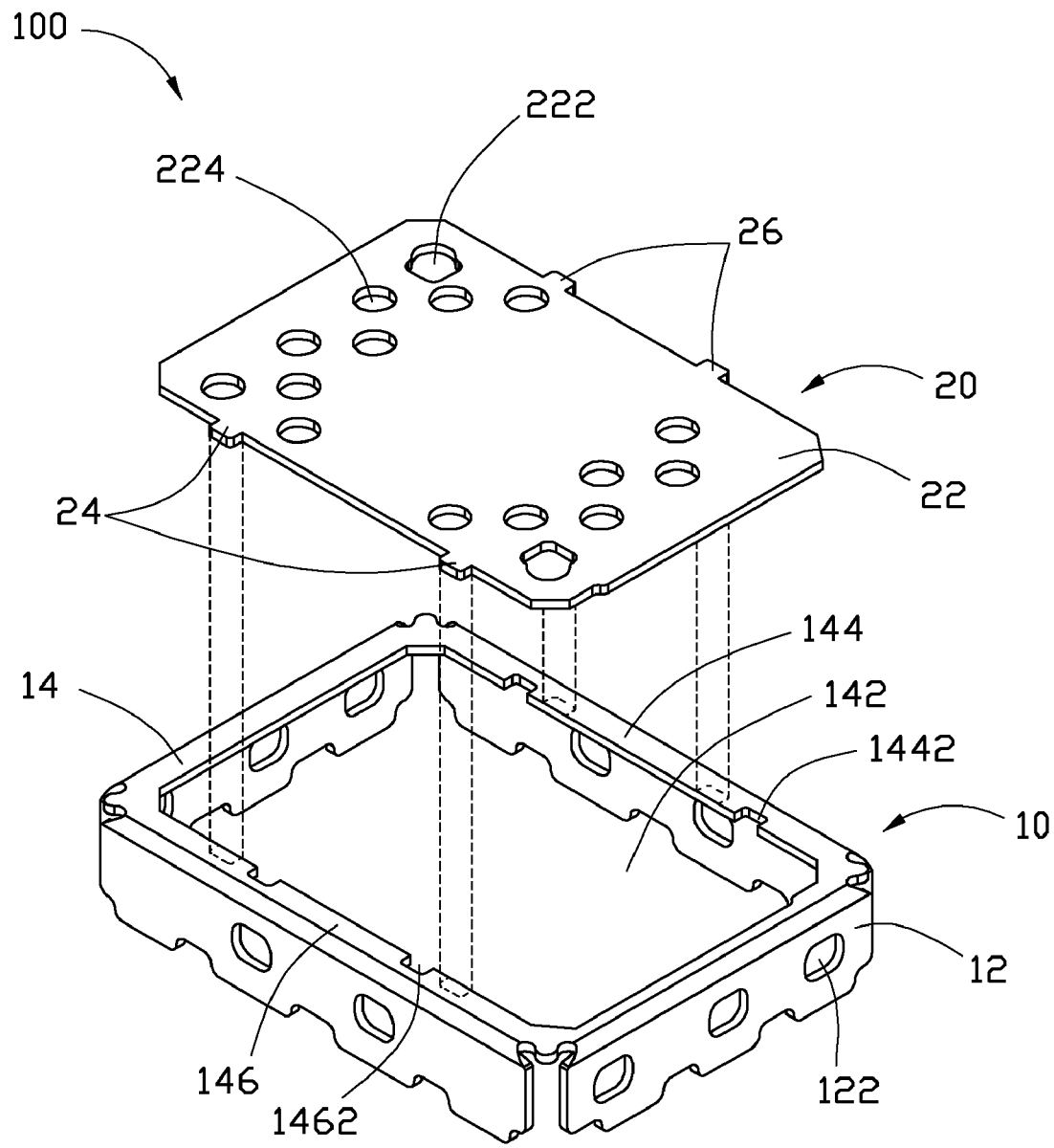
FIG. 1 is an exploded, schematic view of the shield can according to an exemplary embodiment.
Figure 2:
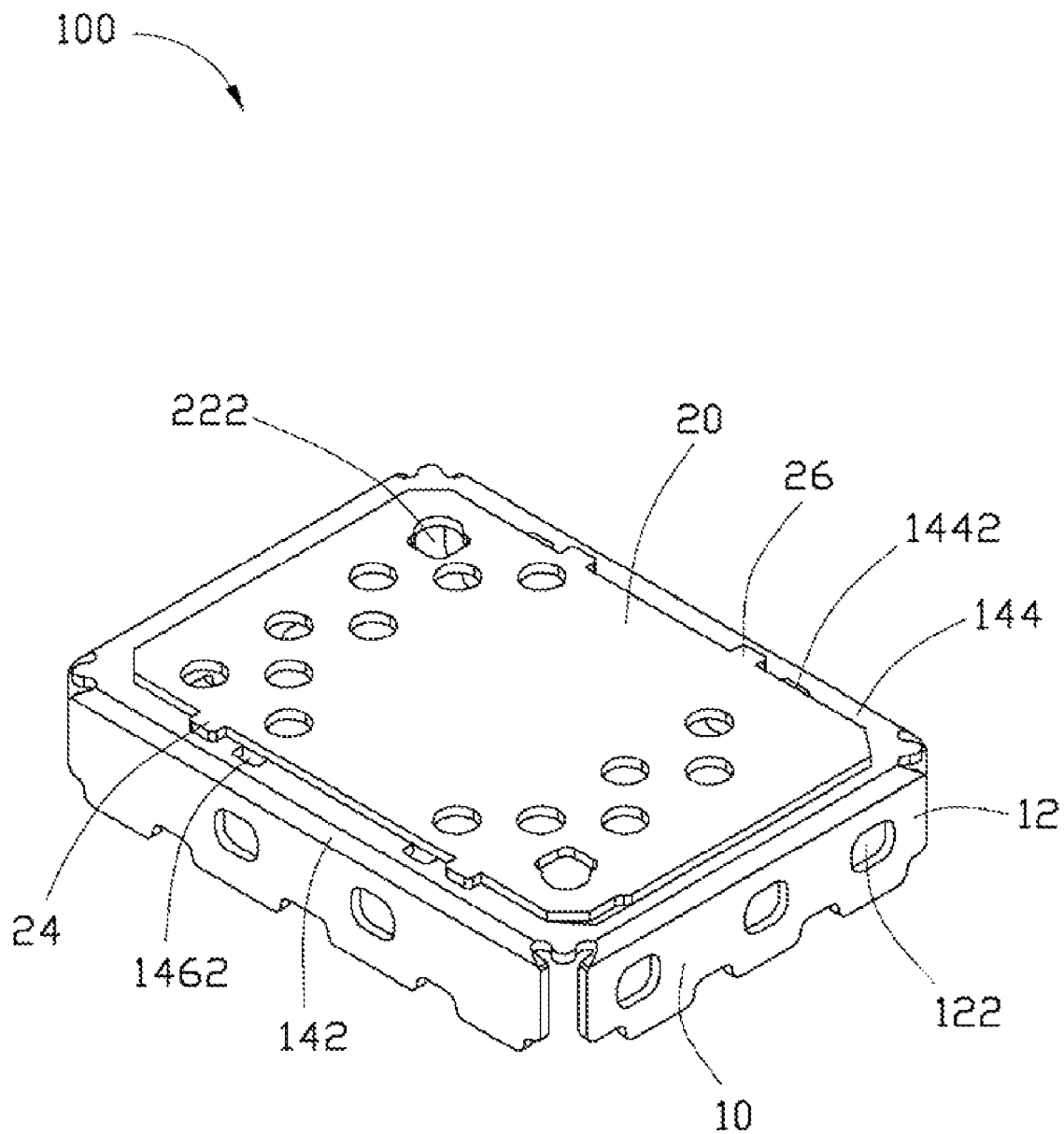
FIG. 2 is an assembled, schematic view of the shield can shown in FIG. 1.

Referring to FIGS. 1 and 2, a shield can 100 according to an exemplary embodiment includes a frame 10 and an enclosure 20 covering the frame 10. The housing 10 and the enclosure 20 are punched from a same metallic plate.

The frame 10 includes a top wall 14 and a plurality of sidewalls 12 extending downwardly from perimeter flange of the top wall 14. The top wall 14 defines a hole 142, two first cutouts 1442, and two second cutouts 1462, all of which is enclosed by a first flange 144 and an opposite second flange 146. The first flange 144 defines two first cutouts 1442 facing the second flange 146, and the second flange 146 defines two second cutouts 1462 facing the first flange 144. The distance spaced between the two first cutouts 1442 is different from the two second cutouts 1462. The two first cutouts 1442 and the second cutouts 1462 communicating with the hole 142. Each of the sidewalls 12 defines a plurality of circumferential latching holes 122 for latching the frame 10 with another outside can (not shown).

The enclosure 20 includes a main plate portion 22, two first protrusions 24 protruding laterally from a side of the main plate portion 22, and two second protrusions 26 protruding laterally from another side of the main plate portion 22 asymmetrically with the first protrusions 24. The main plate portion 22 corresponds to the hole 142 in shape and size, and defines two prying holes 222 and a plurality of circular holes 224 therethrough. The two prying holes 222 are arranged at two corners of the main plate portion 22 and used to pry the enclosure 20 up from the frame 10 by a prying tool. The circular holes 224 are used to disperse heat of the electronic components protected inside the shield can 100. The two first protrusions 24 correspond to the two first cutouts 1442 in shape, size and the relative location. The two first protrusions 24 are received in the first cutouts 1442 and fix with the second flange 146. The two second protrusions 26 corresponds to the two second cutouts 1462 of the second flange 146 in shape, size and their relative locations. The two second protrusions 26 are received in the second cutouts 1462 and fixed with the first flange 144.

The enclosure 20 can be secured to cover the frame 10. The first protrusions 24 and the second protrusions 26 are fixed to the upper surface of the second flange 146 and the upper surface of the first flange 144, such as by soldering. The main plate portion 22 covers and seals the hole 142 of the frame 10.

Figure 3:
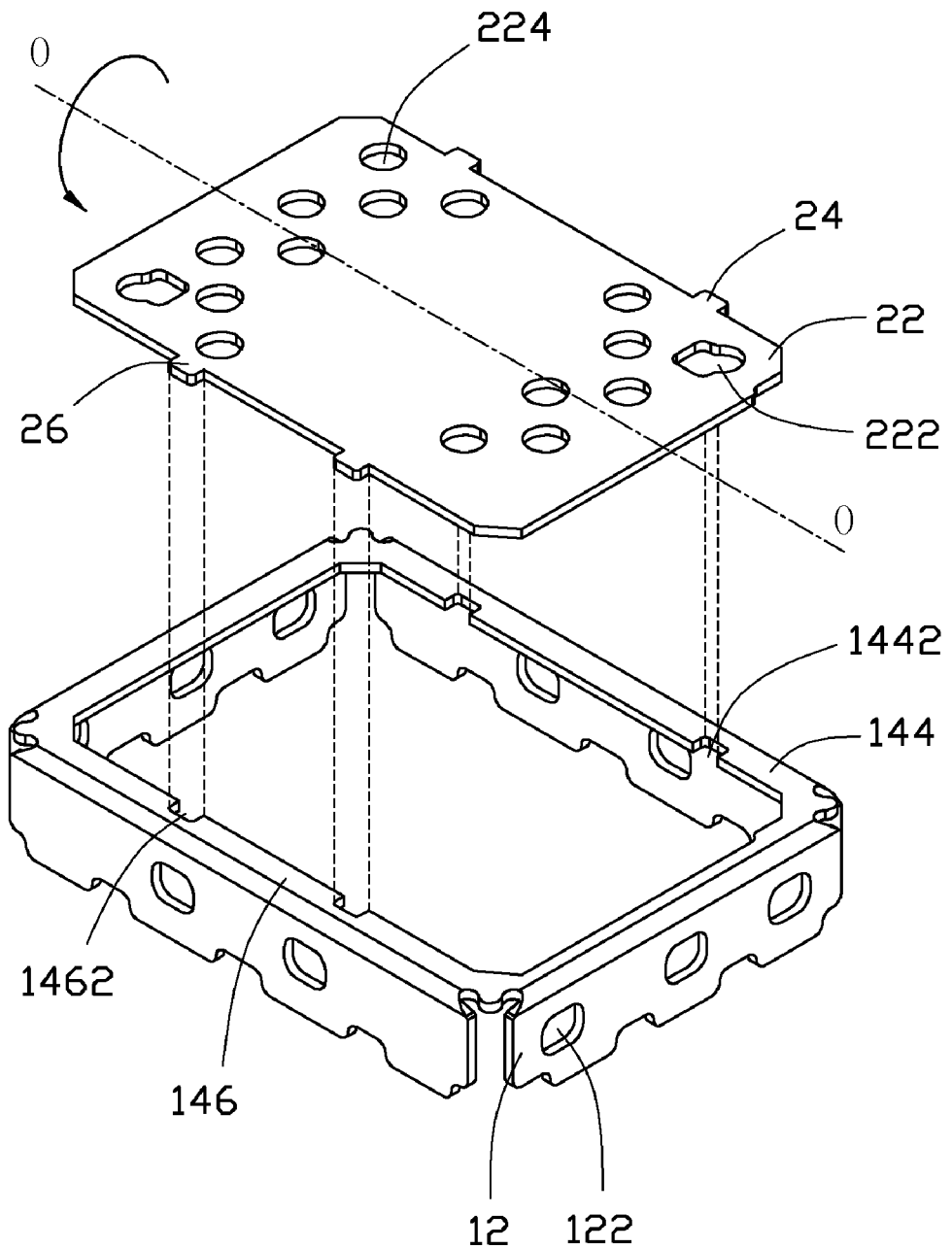
FIG. 3 is a schematic view of the shield can shown in FIG. 1 in fabricating.
Figure 4:
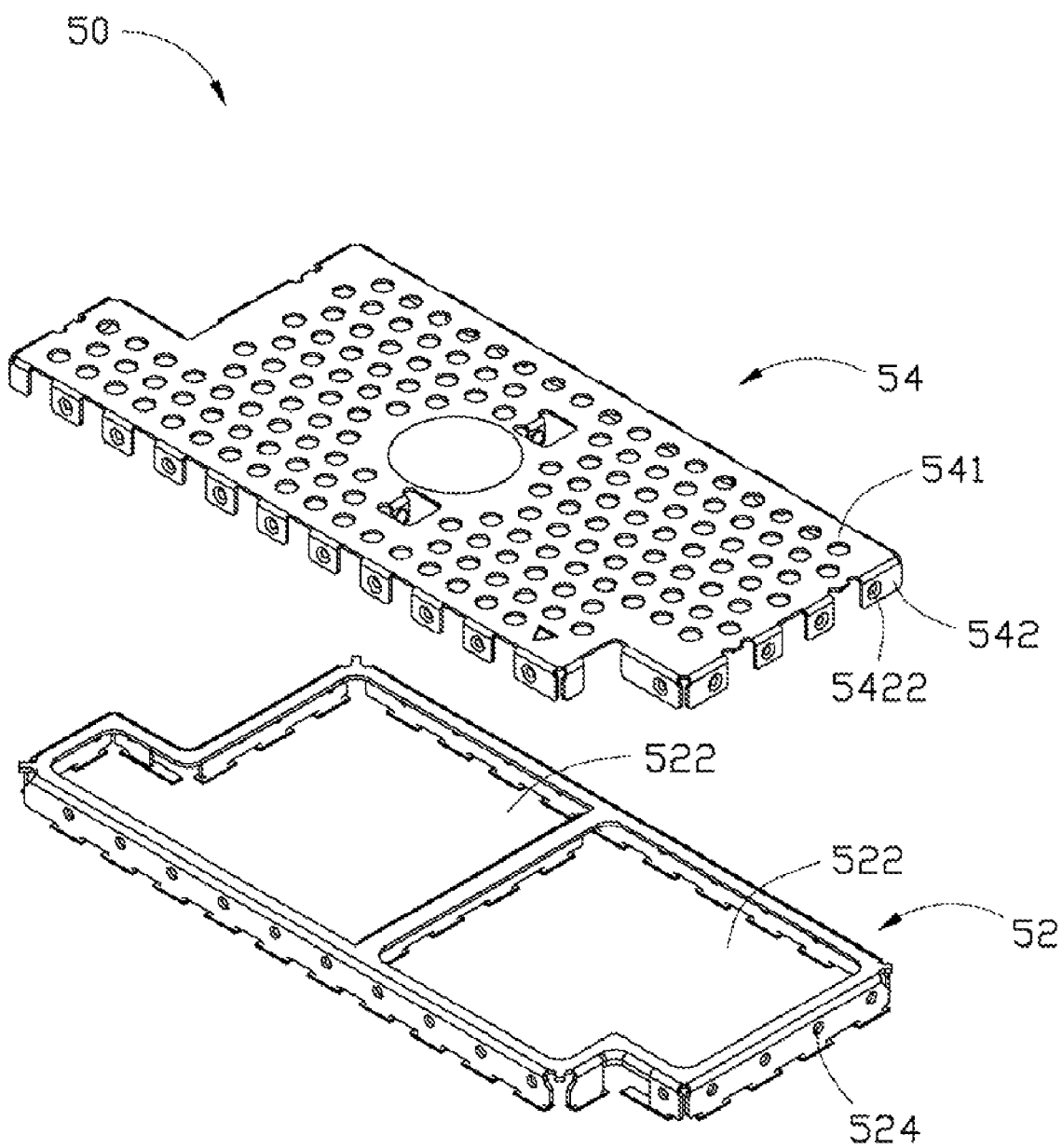
FIG. 4 is an exploded, schematic view of a typical shield can.

Referring to FIG. 3, to manufacture the shield can 100, a single metallic piece is provided to be punched to form the frame 10 and the enclosure 20. The enclosure 20 is separately punched away from the frame 10 and then rotated 180 degrees to align the protrusions with their respective flange for fixing thereto.

It is to be understood that a prying tool can be inserted into one of the prying holes 222 to raise the enclosure 20 away from the frame 10 for exposing the hole 142 and repairing the electronic components shielded by the assembled shield can 100. It can be further understood that an outside shielding can needs to be provided locking and covering the frame 10 by a latching of the latching holes 122 of the frame 10.

It is to be understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. A shield can, comprising:
   a frame having a hole, two first cutouts, and two second cutouts defined in a top wall of the frame, the first cutouts and the second cutouts communicating with the hole;
   a planar enclosure attached to the frame and covering the hole;
   wherein the frame and the planar enclosure are formed by punching a metallic piece, the top wall includes a first flange and an opposite second flange, the first flange defines the two first cutouts formed during the punching of the metallic piece and facing the second flange, the second flange defines the two second cutouts formed during the punching of the metallic piece and facing the first flange, the distance between the two first cutouts is different from the two second cutouts;

the planar enclosure includes a main plate portion, two first protrusions formed during the punching of the metallic piece and two second protrusions formed during the punching of the metallic piece protruding from two opposing sides of the main plate portion respectively, the main plate portion corresponds to the hole in shape and size, each of the two first protrusions having the same structure, the each of the two first protrusions corresponds to each of the two first cutouts in shape and size, each of the two second protrusions having the same structure, and the each of the two second protrusions corresponds to each of the two second cutouts in shape and size; and the planar enclosure is fixed to the top wall with the first protrusions abutting with the upper surface of the second flange and the second protrusions abutting with the upper surface of the first flange.

2. The shield can as claimed in claim 1, wherein the main plate portion defines at least one prying hole and a plurality of circular holes therein, the at least one prying hole is used to disassemble the planar enclosure from the frame, the plurality of circular holes are used to disperse heat.

3. The shield can as claimed in claim 1, wherein the frame includes a plurality of sidewalls extending downwardly from a perimeter flange of the top wall, each sidewall of the plurality of sidewalls defines a plurality of latching holes.

4. A method for fabricating a shield can, comprising:
providing a metallic piece;
punching the metallic piece into at least two pieces forming a frame having a top wall and a planar enclosure having a main plate portion and protrusions, each of the protrusions having the same structure, the frame defining a hole corresponding to the main plate portion in shape and size and a plurality of cutouts, each of the plurality of cutouts corresponding to the each of the protrusions in shape and size, the each of the cutouts communicating with the hole; and attaching the planar to the frame by fixing the protrusions to an upper surface of the top wall, whereby the main plate portion covering the hole.

5. The method for fabricating a shield can as claimed in claim 4, wherein the top wall includes a first flange and an opposite second flange, the first flange defines two first cutouts of the plurality of cutouts facing the second flange, the second flange defines two second cutouts of the plurality of cutouts facing the first flange, the distance between the two first cutouts is different from the distance between the two second cutouts.

6. The method for fabricating a shield can as claimed in claim 5, wherein the protrusions of the planar enclosure includes two first protrusions and two second protrusions, the first protrusions protrudes from a side of the main plate portion, the two second protrusions protrudes from an opposite side of the main plate portion, each of the two first protrusions corresponds to each of the two first cutouts in shape and size, and each of the two second protrusions corresponds to each of the two second cutouts in shape and size.

7. The method for fabricating a shield can as claimed in claim 6, wherein the each of the first protrusions are fixed to the upper surface of the second flange by soldering, and the each of the second protrusions are fixed to the upper surface of the first flange by soldering.

8. The method for fabricating a shield can as claimed in claim 7, wherein the each of the first protrusions are defined by the each of the first cutouts of the frame, and the each of the second protrusions are defined by the each of the second cutouts of the frame.

9. The method for fabricating a shield can as claimed in claim 7, wherein the main plate portion defines at least one prying hole and a plurality of circular holes therein, the at least one prying hole is used to disassemble the planar enclosure from the frame, the plurality of circular holes are used to disperse heat.

\* \* \* \* \*